United States Patent
Shimizu et al.

(10) Patent No.: US 9,832,878 B2
(45) Date of Patent: Nov. 28, 2017

(54) WIRING BOARD WITH CAVITY FOR BUILT-IN ELECTRONIC COMPONENT AND METHOD FOR MANUFACTURING THE SAME

(71) Applicant: IBIDEN CO., LTD., Ogaki (JP)

(72) Inventors: Keisuke Shimizu, Ogaki (JP); Makoto Terui, Ogaki (JP); Ryojiro Tominaga, Ogaka (JP); Yuichi Nakamura, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 5 days.

(21) Appl. No.: 14/819,579

(22) Filed: Aug. 6, 2015

(65) Prior Publication Data
US 2016/0044789 A1 Feb. 11, 2016

(30) Foreign Application Priority Data
Aug. 6, 2014 (JP) .................. 2014-160690

(51) Int. Cl.
| | |
|---|---|
| H05K 1/18 | (2006.01) |
| H05K 3/30 | (2006.01) |
| H05K 3/46 | (2006.01) |
| H05K 1/02 | (2006.01) |
| H05K 3/42 | (2006.01) |

(52) U.S. Cl.
CPC .......... H05K 1/185 (2013.01); H05K 3/4694 (2013.01); *H05K 1/0224* (2013.01); *H05K 3/305* (2013.01); *H05K 3/429* (2013.01); *H05K 2201/09536* (2013.01); *H05K 2201/09745* (2013.01); *H05K 2201/10378* (2013.01); *H05K 2201/2072* (2013.01)

(58) Field of Classification Search
CPC ........ H05K 1/183; H05K 1/188; H05K 1/185; H05K 1/186; H05K 1/187; H05K 3/301; H01L 23/3142; H01L 23/315
See application file for complete search history.

(56) References Cited

U.S. PATENT DOCUMENTS

| | | | | |
|---|---|---|---|---|
| 5,756,380 A | * | 5/1998 | Berg | ................... H01L 23/3128 438/125 |
| 8,132,320 B2 | * | 3/2012 | Wang | .................. H01L 21/4857 174/250 |
| 8,222,539 B2 | | 7/2012 | Kawamura et al. | |

(Continued)

FOREIGN PATENT DOCUMENTS

JP 2011-211194 A 10/2011

OTHER PUBLICATIONS

U.S. Appl. No. 14/847,396, filed Sep. 8, 2015, Shimizu, et al.
U.S. Appl. No. 14/817,388, filed Aug. 4, 2015, Shimizu, et al.

*Primary Examiner* — Jeremy C Norris
(74) *Attorney, Agent, or Firm* — Oblon, McClelland, Maier & Neustadt, L.L.P.

(57) ABSTRACT

A wiring board with a cavity for a built-in electronic component includes a conductor layer including a conductor circuit layer and a plane layer, and an insulating layer laminated on the conductor layer and having a cavity such that the cavity is forming an exposed portion of the plane layer and formed to mount a built-in electronic component on the exposed portion of the plane layer. The plane layer has a recess structure formed in an outer peripheral portion in the exposed portion of the plane layer.

20 Claims, 19 Drawing Sheets

(56) References Cited

U.S. PATENT DOCUMENTS

| | | | |
|---|---|---|---|
| 8,431,441 B2* | 4/2013 | Chino | H01L 21/561 |
| | | | 257/E21.504 |
| 8,525,041 B2 | 9/2013 | Shimizu et al. | |
| 8,785,788 B2 | 7/2014 | Shimizu et al. | |
| 8,952,507 B2 | 2/2015 | Shimabe et al. | |
| 9,113,575 B2 | 8/2015 | Shimizu | |
| 2010/0212946 A1 | 8/2010 | Shimizu et al. | |
| 2010/0224397 A1 | 9/2010 | Shimizu et al. | |
| 2014/0144686 A1 | 5/2014 | Shimizu | |
| 2015/0043183 A1* | 2/2015 | Ishiguro | H05K 1/185 |
| | | | 361/761 |

* cited by examiner

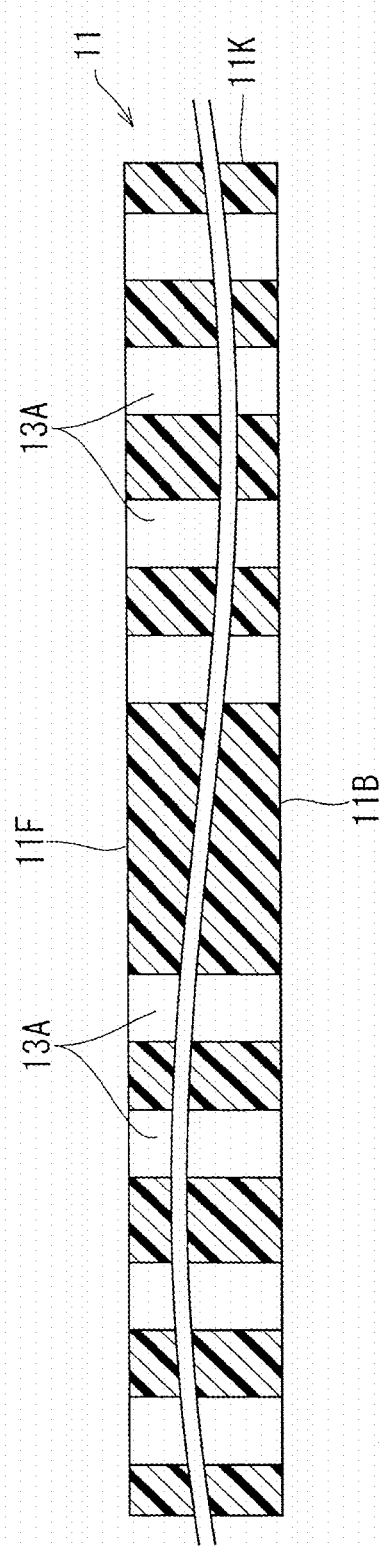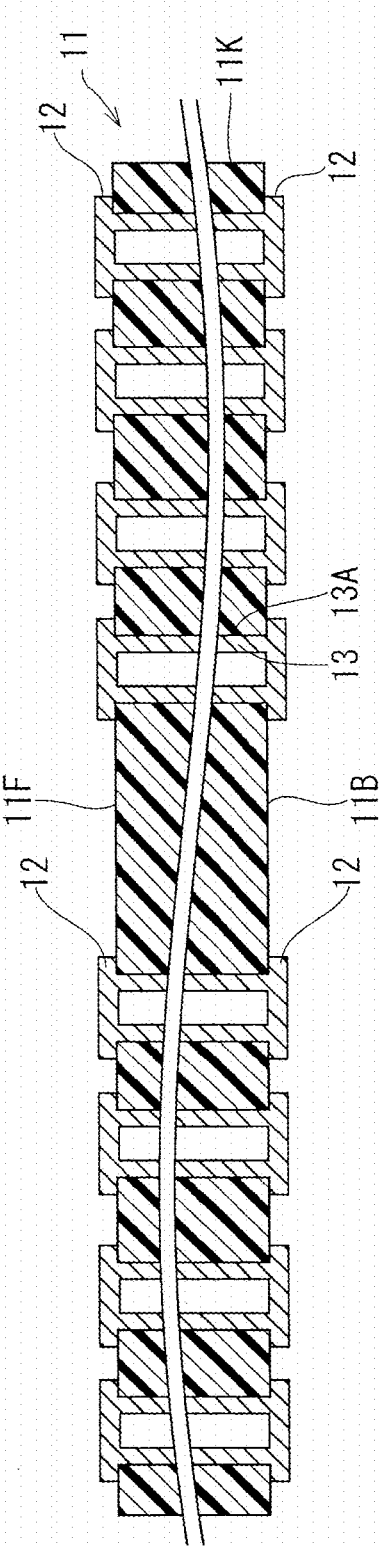

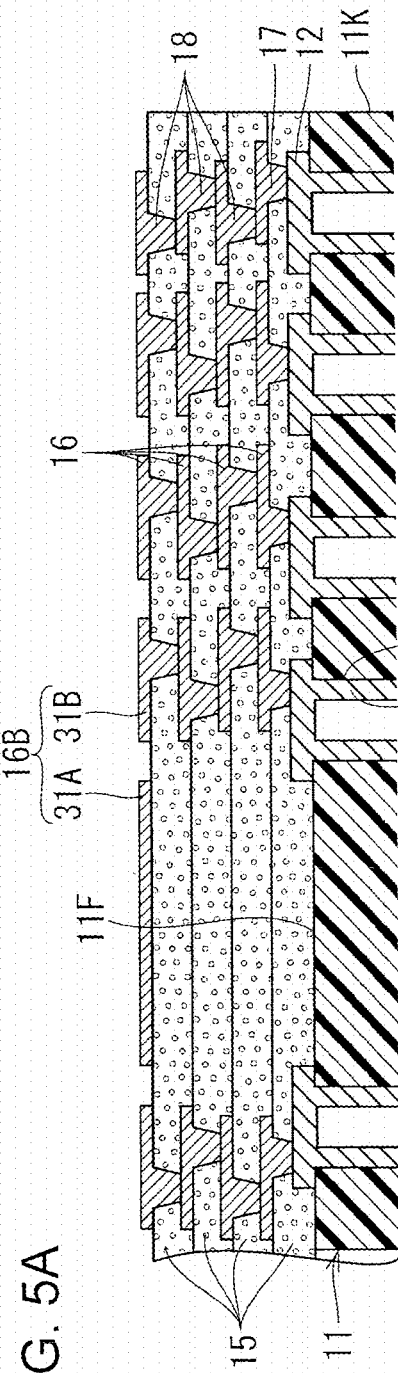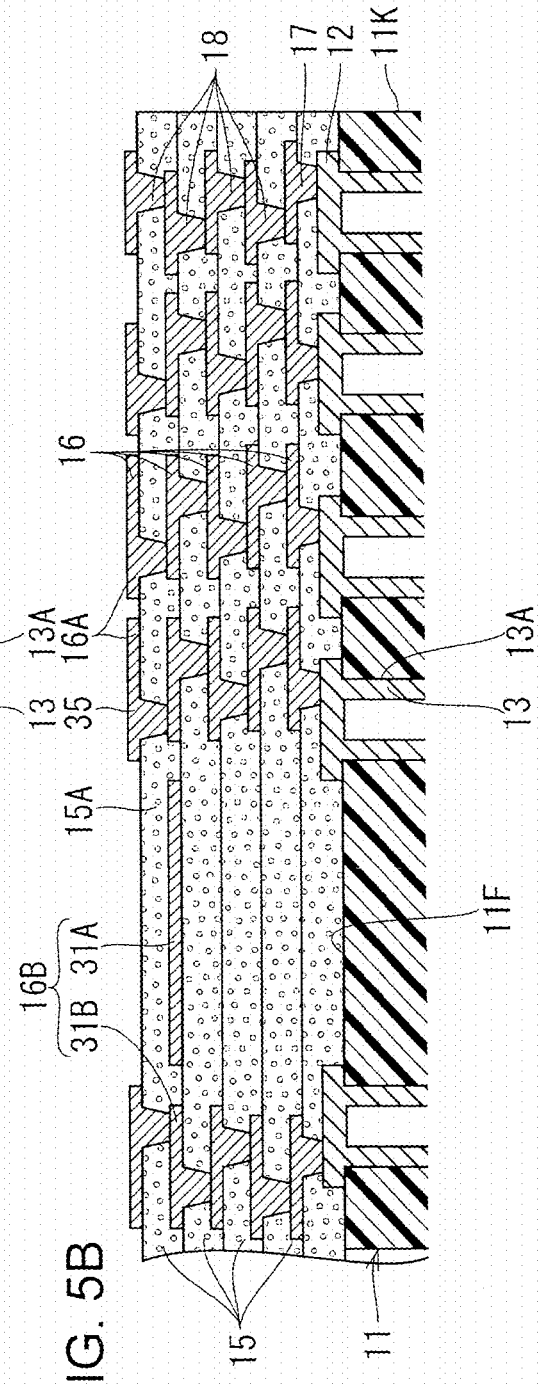

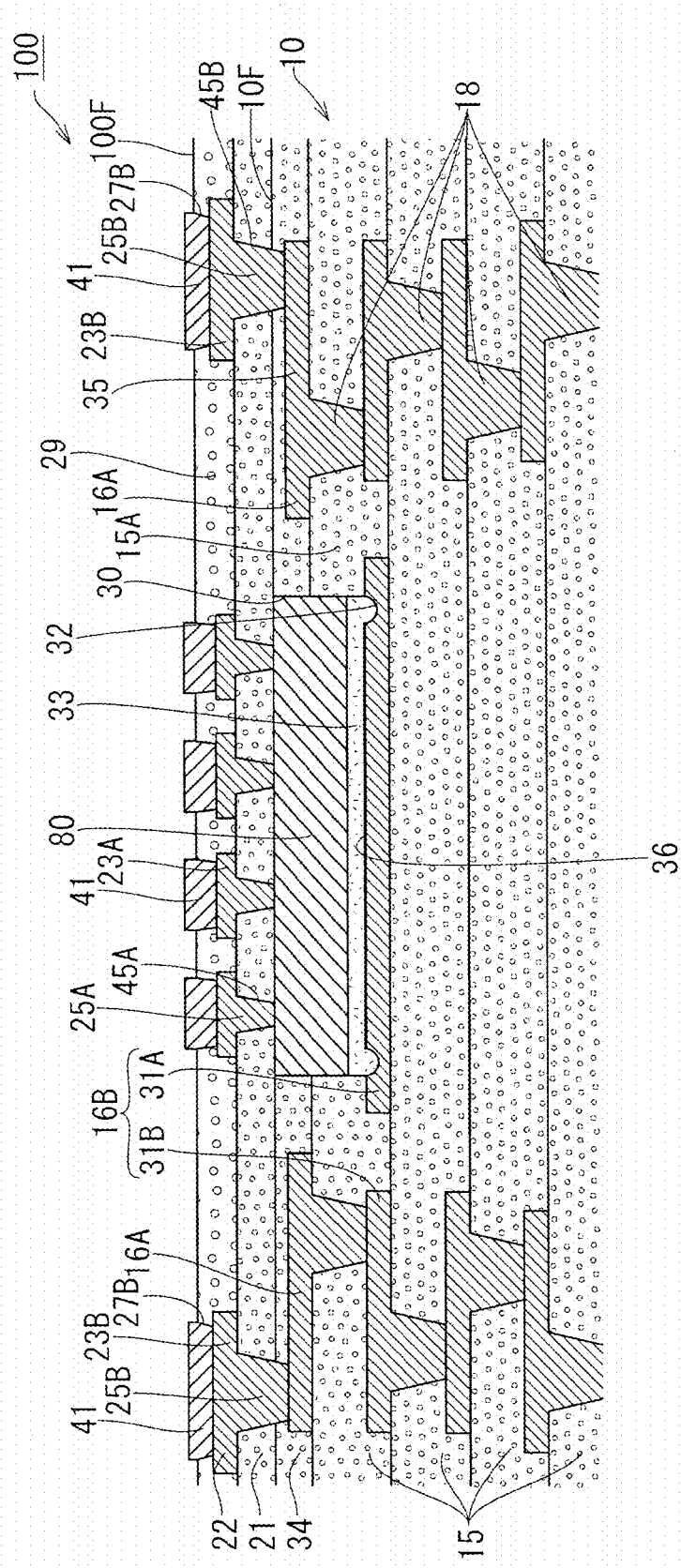

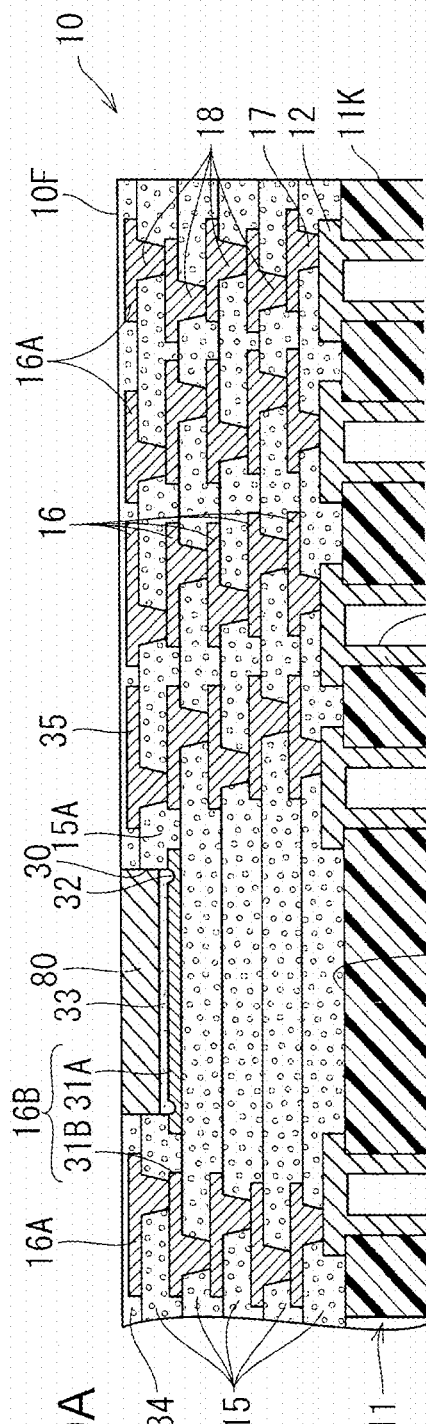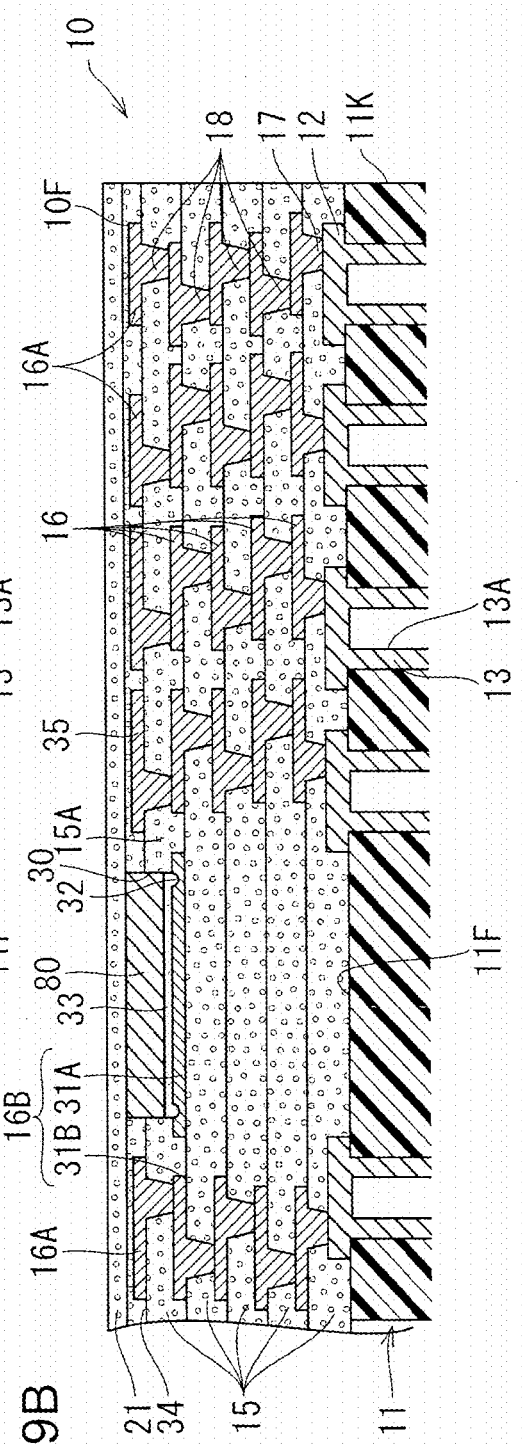

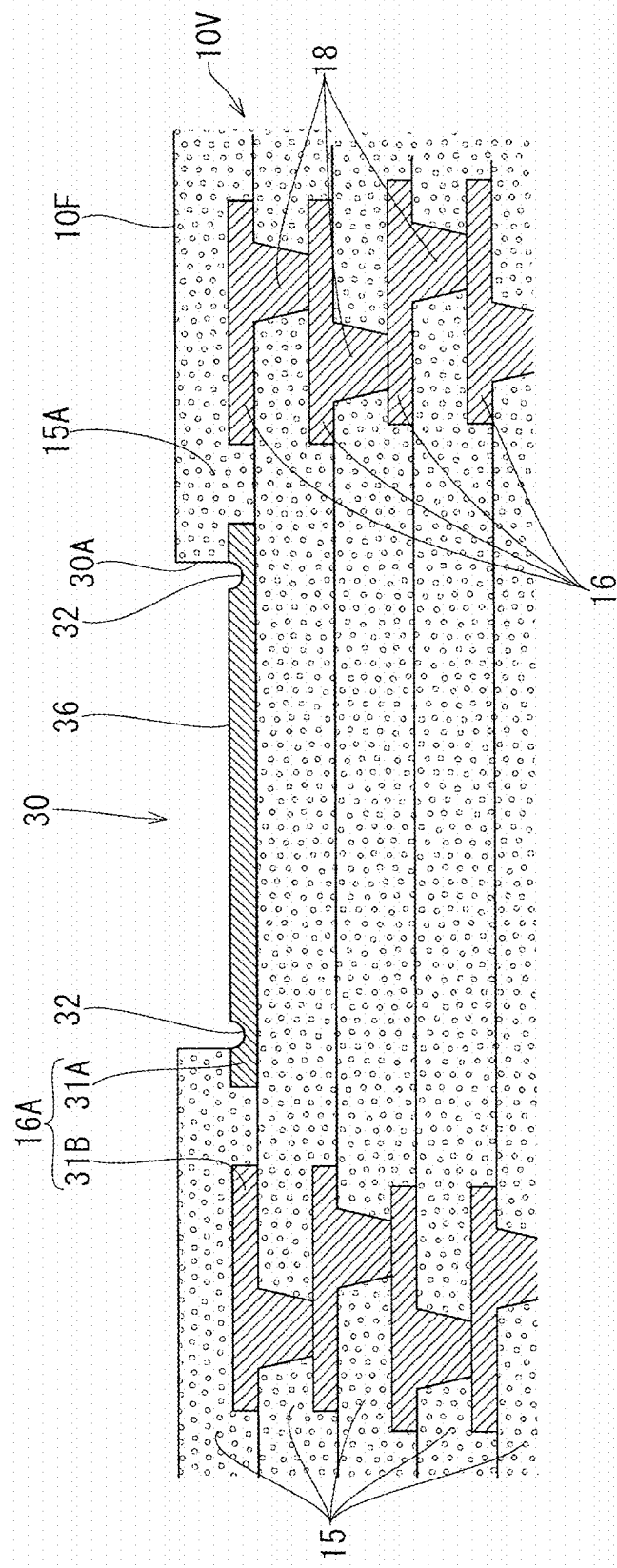

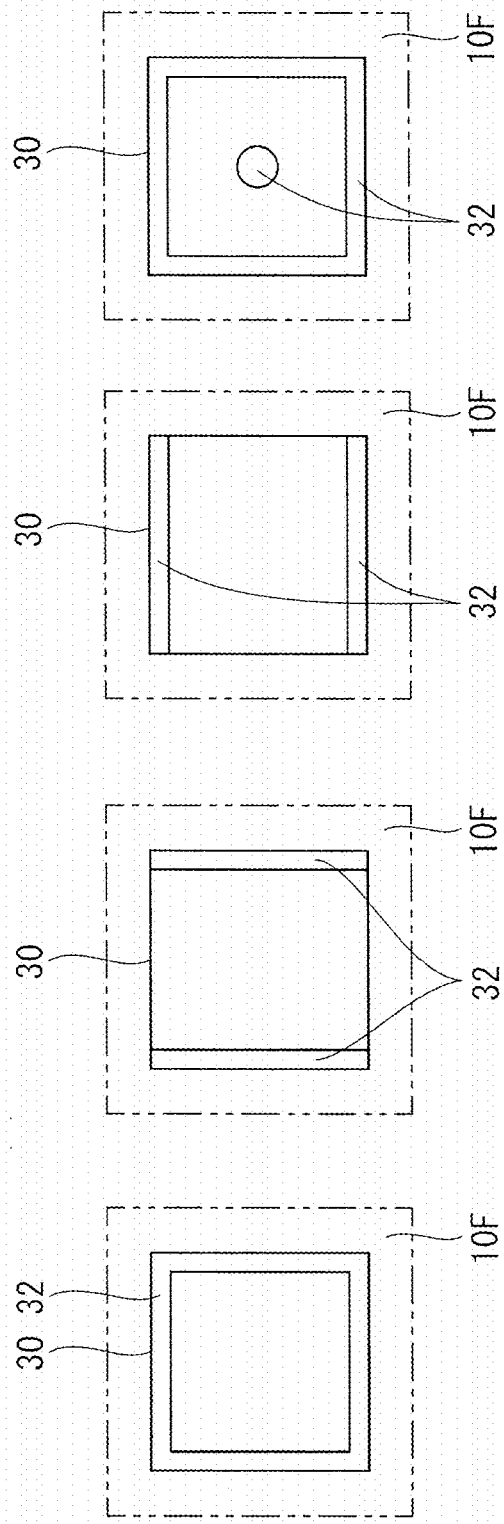

US 9,832,878 B2

WIRING BOARD WITH CAVITY FOR BUILT-IN ELECTRONIC COMPONENT AND METHOD FOR MANUFACTURING THE SAME

CROSS-REFERENCE TO RELATED APPLICATIONS

The present application is based upon and claims the benefit of priority to Japanese Patent Application No. 2014-160690, filed Aug. 6, 2014, the entire contents of which are incorporated herein by reference.

BACKGROUND OF THE INVENTION

Field of the Invention

The present invention relates to a wiring board with a cavity for a built-in electronic component (the wiring board having a cavity for a built-in electronic component) and relates to a method for manufacturing the wiring board.

Description of Background Art

Japanese Patent Laid-Open Publication No. 2011-211194 describes a wiring board with a built-in electronic component (the wiring board having a built-in electronic component) and a wiring board with a cavity for a built-in electronic component (the wiring board having a cavity for a built-in electronic component) in manufacturing such a wiring board with a built-in electronic component. The entire contents of this publication are incorporated herein by reference.

SUMMARY OF THE INVENTION

According to one aspect of the present invention, a wiring board with a cavity for a built-in electronic component includes a conductor layer including a conductor circuit layer and a plane layer, and an insulating layer laminated on the conductor layer and having a cavity such that the cavity is forming an exposed portion of the plane layer and formed to mount a built-in electronic component on the exposed portion of the plane layer. The plane layer has a recess structure formed in an outer peripheral portion in the exposed portion of the plane layer.

According to another aspect of the present invention, a method for manufacturing a wiring board with a cavity for a built-in electronic component includes forming an insulating layer on a conductor layer including a conductor circuit layer and a plane layer such that the insulating layer covers the conductor circuit layer and the plane layer, and forming a cavity through the insulating layer such that the cavity forms an exposed portion of the plane layer and is formed to mount a built-in electronic component on the exposed portion of the plane layer, and forming a recess structure in an outer peripheral portion in the exposed portion of the plane layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3A and 3B are cross-sectional views illustrating manufacturing processes of the wiring board with the cavity for a built-in electronic component;

FIGS. 5A and 5B are cross-sectional views illustrating manufacturing processes of the wiring board with the cavity for a built-in electronic component;

FIG. 8 is an enlarged cross-sectional view around the electronic component of the wiring board with the built-in electronic component;

FIGS. 9A and 9B are cross-sectional views illustrating manufacturing processes of the wiring board with the built-in electronic component;

FIG. 17 is a cross-sectional view of a wiring board with a cavity for a built-in electronic component according to a modified embodiment;

FIG. 19A-19D are plan views of cavities according to modified embodiments.

DETAILED DESCRIPTION OF THE EMBODIMENTS

Figure 1:
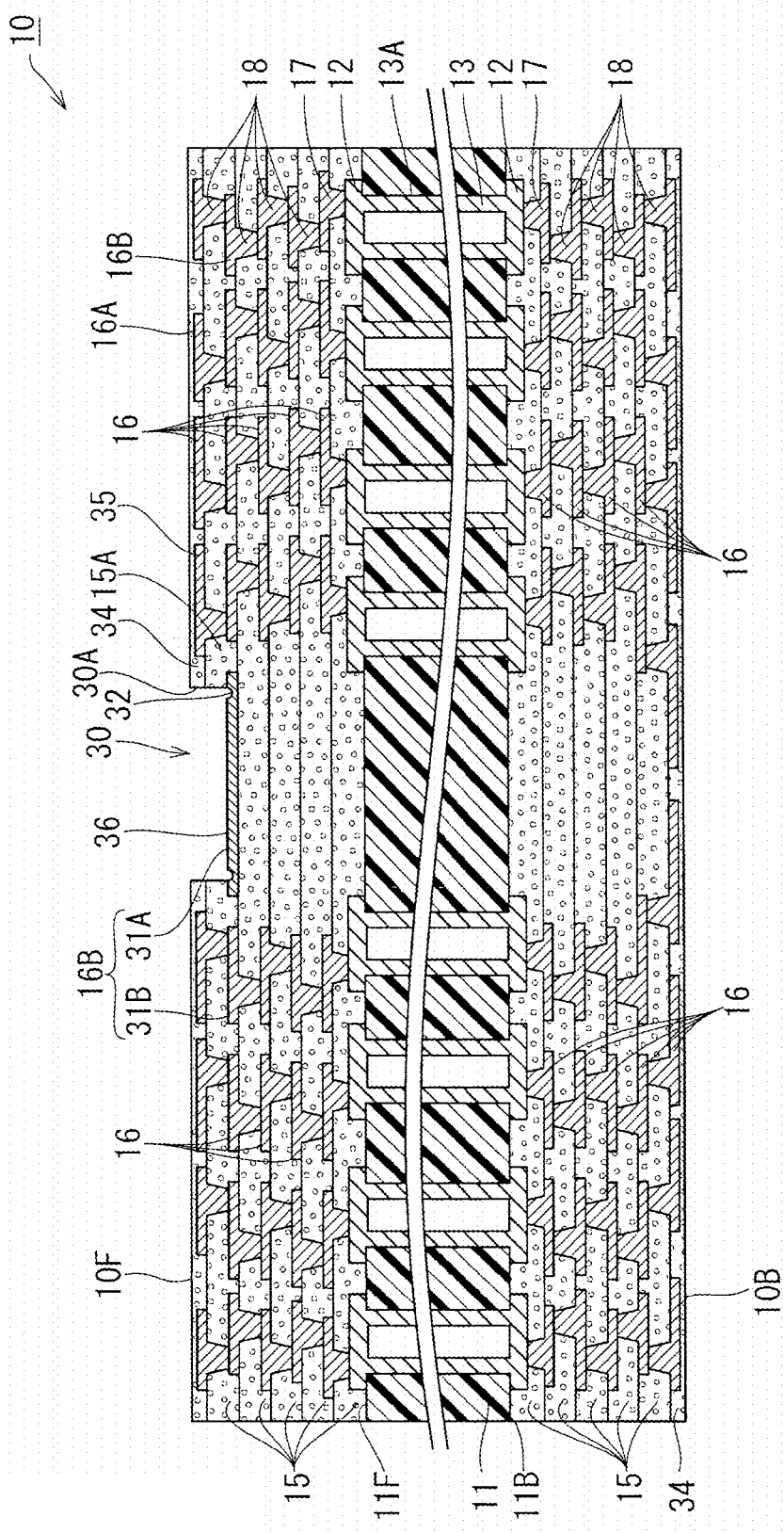
FIG. 1 is a cross-sectional view of a wiring board with a cavity for a built-in electronic component according to an embodiment of the present invention.

The embodiments will now be described with reference to the accompanying drawings, wherein like reference numerals designate corresponding or identical elements throughout the various drawings.

As illustrated in FIG. 1, a wiring board 10 with a cavity for a built-in electronic component (hereinafter, simply referred to as the wiring board 10) according to the present embodiment has a multilayer structure in which build-up insulating layers 15 and build-up conductor layers 16 are alternately laminated on each of both an F surface (11F), which is a front side surface of a core substrate 11, and a B surface (11B), which is a back side surface of the core substrate 11.

The core substrate 11 has a thickness of about 700 µm. A core conductor layer 12 is formed on each of both the front and back surfaces of the core substrate 11. The core conductor layer 12 has a thickness of about 35 µm. The build-up insulating layers 15 are each formed of an insulating material and each have a thickness of about 10-30 µm. The build-up conductor layers 16 are each formed of metal (such as copper) and each have a thickness of about 7-15 µm. The thickness of each of the build-up insulating layers 15 is defined by a distance between the conductor layers above and below the insulating layer.

The front side core conductor layer 12 and the back side core conductor layer 12 are connected by a through-hole conductor 13 that penetrates through the core substrate 11. The through-hole conductor 13 is formed by forming, for example, copper plating on a wall surface of a through hole (13A) that penetrates through the core substrate 11.

An innermost build-up conductor layer 16, which is closest to the core substrate 11, and the core conductor layer 12 are connected by a via 17 that penetrates through an innermost build-up insulating layer 15. Further, build-up conductor layers (16, 16) that are adjacent to each other in a lamination direction are connected by a via 18 that penetrates through a build-up insulating layer 15 that is positioned between the build-up conductor layers (16, 16).

In the wiring board 10 of the present embodiment, a conductor circuit layer (31B) and a plane layer (31A) are formed in a second build-up conductor layer (16B) that is among the build-up conductor layers 16 laminated on the F surface (11F) side of the core substrate 11 and is positioned second from an outer side. The plane layer (31A) is formed in a solid shape as a ground layer that is grounded. The plane layer (31A) is arranged near a central portion of the wiring board 10, and the conductor circuit layer (31B) is arranged in a manner sandwiching the plane layer (31A) from both sides.

An outer side conductor circuit layer 35 (corresponding to an "outer side conductor layer" according to an embodiment of the present invention) that is connected via the via 18 to the conductor circuit layer (31B) is formed in a first build-up conductor layer (16A) that is arranged on an outermost outer side. Further, a protective layer 34 is laminated on the first build-up conductor layer (16A). The protective layer 34 is formed of the same material as the build-up insulating layers 15. The protective layer 34 has a thickness of about 7-15 µm and is thinner than each of the build-up insulating layers 15. Protective layers 34 respectively form an F surface (10F), which is a front side surface of the wiring board 10, and a B surface (10B), which is a back side surface of the wiring board 10. However, it is also possible that a protective layer 34 is not formed on the back side surface of the wiring board 10.

A cavity 30 having an opening (30A) on the F surface (10F) of the wiring board 10 is formed in the wiring board 10. The cavity 30 penetrates through a first build-up insulating layer (15A) positioned on an outermost side and the protective layer 34, and exposes the plane layer (31A) as a bottom surface.

Figure 2:
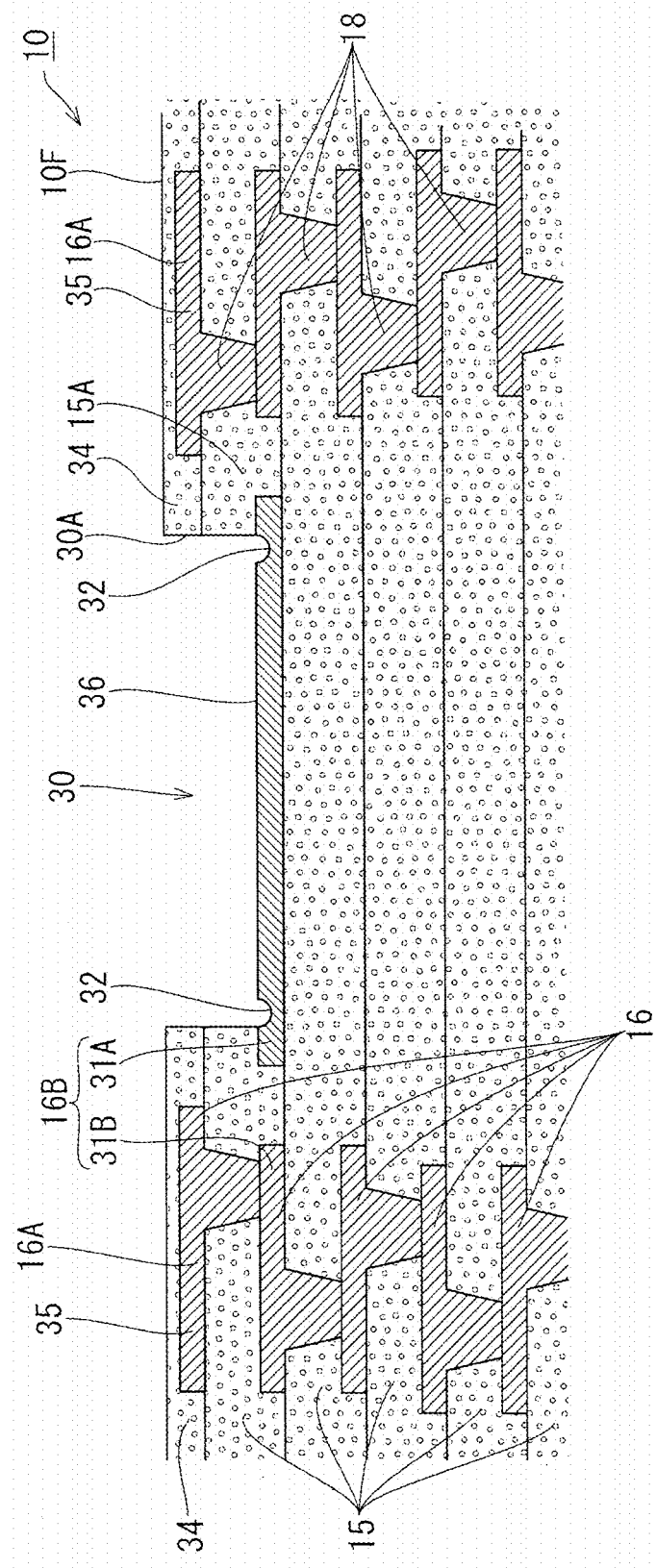
FIG. 2 is an enlarged cross-sectional view around the cavity of the wiring board with the cavity for a built-in electronic component.

As illustrated in FIG. 2, an area of the opening (30A) of the cavity 30 is smaller than an area of the plane layer (31A), and an outer peripheral portion of the plane layer (31A) protrudes to an outer side of the cavity 30. In other words, the plane layer (31A) forms the entire bottom surface of the cavity 30.

A recess 32 is formed in an outer peripheral portion of the portion of the plane layer (31A) that is exposed as the bottom surface of the cavity 30. The recess 32 has a depth of about 0.5-3 µm. Further, a roughened layer 36 is formed on a surface of the portion of the plane layer (31A) that is exposed as the bottom surface of the cavity 30.

The description about the structure of the wiring board 10 is as given above. Next, a method for manufacturing the wiring board 10 is described based on FIG. 3A-6B.

The wiring board 10 is manufactured as follows.

(1) As illustrated in FIG. 3A, the through hole (13A) is formed in the core substrate 11 by, for example, drilling or the like. The core substrate 11 is obtained by laminating a copper foil (not illustrated in the drawings) on each of both front and back surfaces of an insulating base material (11K) that is made of epoxy resin or BT (bismaleimide triazine) resin and a reinforcing material such as a glass cloth.

(2) An electroless plating treatment, a plating resist treatment and an electrolytic plating treatment are performed. The core conductor layer 12 is formed on each of the F surface (11F) and the B surface (11B) of the core substrate 11, and the through-hole conductor 13 is formed on an inner surface of the through hole (13A) (see FIG. 3B). A method for manufacturing the core substrate 11 may be a manufacturing method as illustrated in FIGS. 1 and 2 of Japanese Patent Laid-Open Publication No. 2012-69926, the entire contents of which are incorporated herein by reference.

Figure 4A:
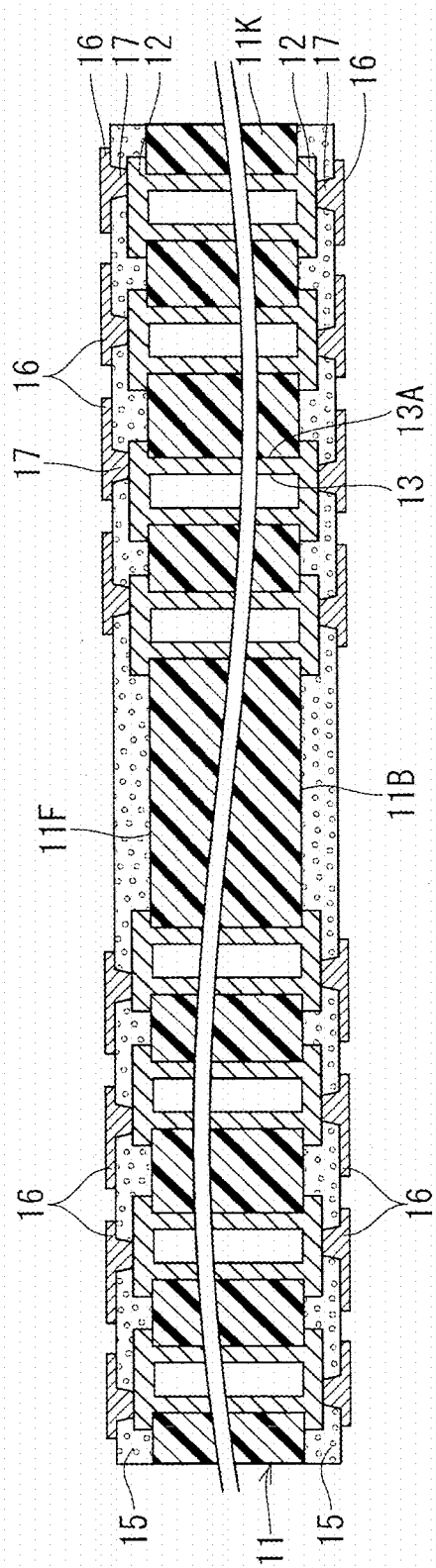
FIGS. 4A and 4B are cross-sectional views illustrating manufacturing processes of the wiring board with the cavity for a built-in electronic component.

(3) As illustrated in FIG. 4A, a build-up insulating layer 15 is laminated on the core conductor layer 12, and a build-up conductor layer 16 is laminated on the build-up insulating layer 15. Specifically, a prepreg (a resin sheet of a B-stage formed by impregnating a core material with resin) as a build-up insulating layer 15 and a copper foil (not illustrated in the drawings) are laminated on the core conductor layer 12 on each of the F surface (11F) side and the B surface (11B) side of the core substrate 11. Then, the resulting substrate is hot-pressed. Then, CO2 laser is irradiated to the copper foil, and a via formation hole that penetrates through the copper foil and the build-up insulating layer 15 is formed. Then, an electroless plating treatment, a plating resist treatment and an electrolytic plating treatment are performed. The via formation hole is filled with electrolytic plating and a via 17 is formed, and a build-up conductor layer 16 of a predetermined pattern is formed on the build-up insulating layer 15. Instead of the prepreg, it is also possible to use a resin film that does not contain a core material as the build-up insulating layer 15. In this case, without laminating a copper foil, a conductor layer can be directly formed on a surface of the resin film using a semi-additive method.

Figure 4B:
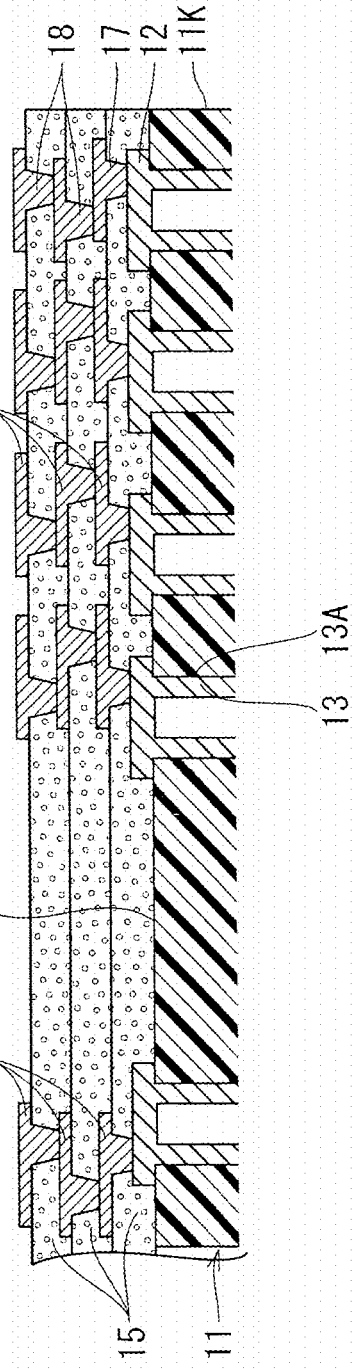

(4) In the same manner as the process of FIG. 4A, build-up insulating layers 15 and build-up conductor layers 16 are alternately laminated on each of the F surface (11F) side and the B surface (11B) side of the core substrate 11 (see FIG. 4B; in FIG. 4B, only the F surface (11F) side is illustrated; this applies also to FIG. 5A-6B in the following). In this case, a via 18 that penetrates through a build-up insulating layer 15 is formed, and build-up insulating layers (16, 16) that are adjacent to each other in the lamination direction are connected by the via 18.

(5) As illustrated in FIG. 5A, a build-up insulating layer 15 is laminated and a build-up conductor layer 16 is laminated on the build-up insulating layer 15, and the second build-up conductor layer (16B) is formed. In this case, the conductor circuit layer (31B), which is connected to an inner side build-up conductor layer 16 via a via 18, and the solid-shaped plane layer (31A) are formed in the second build-up conductor layer (16B).

(6) As illustrated in FIG. 5B, on the second build-up conductor layer (16B), a build-up insulating layer 15 and a build-up conductor layer 16 are laminated, and the first build-up insulating layer (15A) and the first build-up conductor layer (16A) are formed. In this case, on the plane layer (31A), only the first build-up insulating layer (15A) is laminated. Further, in the first build-up conductor layer (16A), the outer side conductor circuit layer 35 is formed that is connected to the conductor circuit layer (31B) via a via 18 that penetrates through the first build-up insulating layer (15A).

Figure 6A:
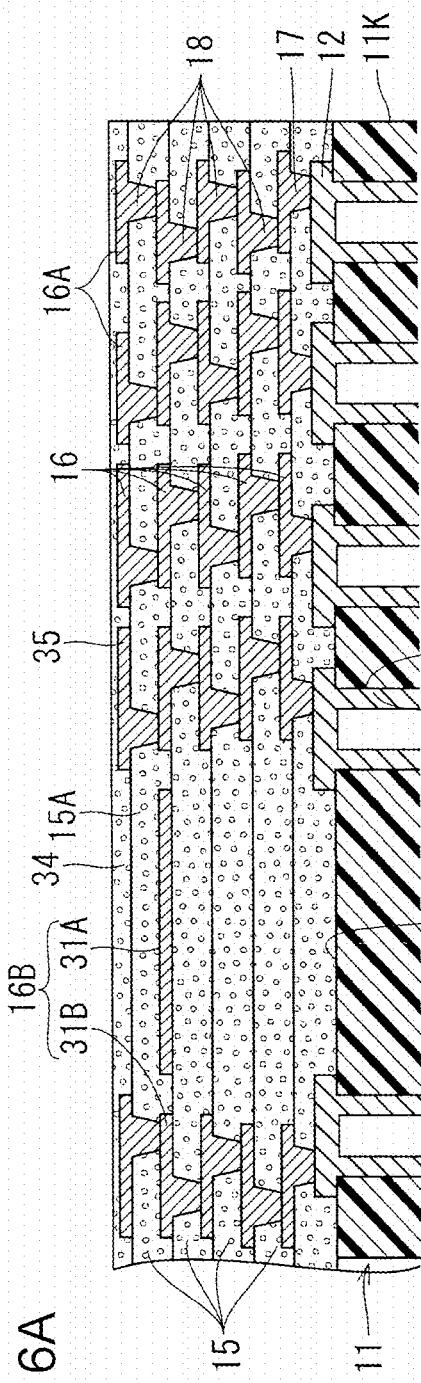
FIGS. 6A and 6B are cross-sectional views illustrating manufacturing processes of the wiring board with the cavity for a built-in electronic component.

(7) As illustrated in FIG. 6A, on the build-up conductor layer 16, the protective layer 34 made of the same material as the build-up insulating layer 15 is laminated. In this case, on the plane layer (31A), the build-up layer 15 and the protective layer 34 are laminated. However, the material of the protective layer 34 is not particularly limited, and may be, for example, an acrylic resin having an elastic modulus of 1-10 GPa, an epoxy resin, and an adhesive such as polyimide.

Figure 6B:
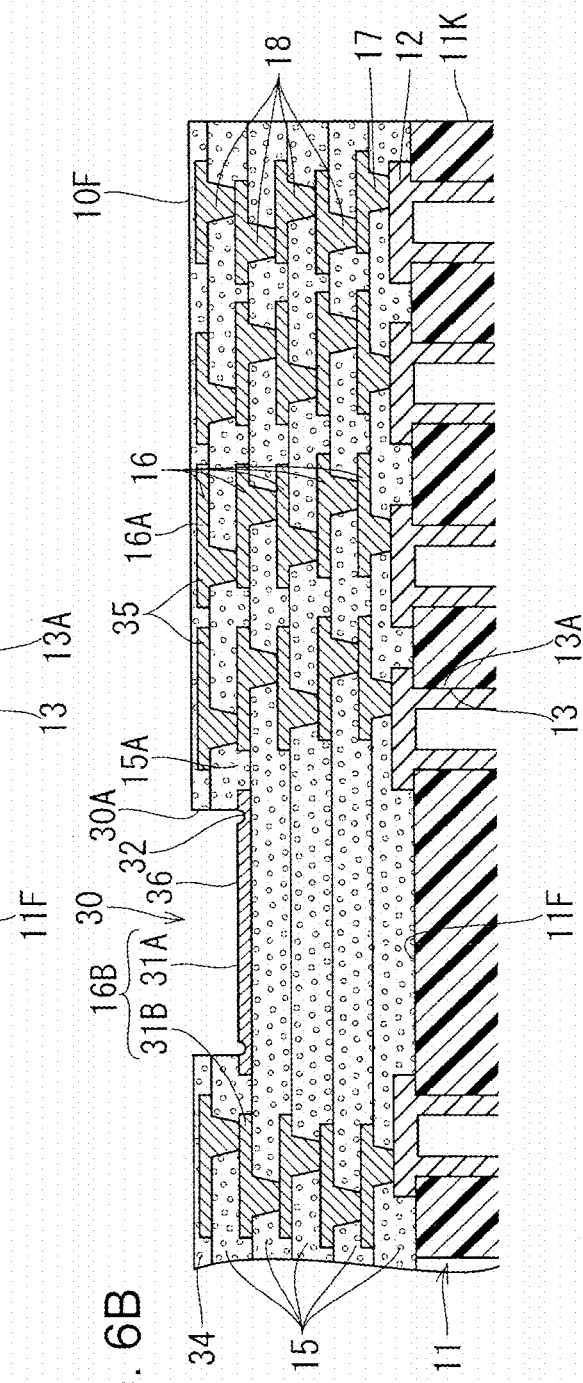

(8) As illustrated in FIG. 6B, by irradiating, for example, CO2 laser from the F surface (11F) side of the core substrate 11, the cavity 30 that exposes the plane layer (31A) as a bottom surface is formed in the protective layer 34 and the first build-up insulating layer (15A). Here, an area of a range in which laser is irradiated, that is, an opening area of the cavity 30, is smaller than an area of the plane layer (31A), so that the entire bottom surface of the cavity 30 is formed by the plane layer (31A) alone. Further, by strongly irradiating laser to the outer peripheral portion of the cavity 30, the recess 32 is formed in the outer peripheral portion of the portion of the plane layer (31A) that is exposed as the bottom surface of the cavity 30.

(9) The plane layer (31A) that is exposed as the bottom surface of the cavity 30 is subjected to a desmear treatment, and the roughened layer 36 is formed on the surface of the plane layer (31A) by a roughening treatment. When the desmear treatment is performed, the outer side conductor circuit layer 35 is protected by the protective layer 34. Thus, the wiring board 10 is completed.

Figure 7:
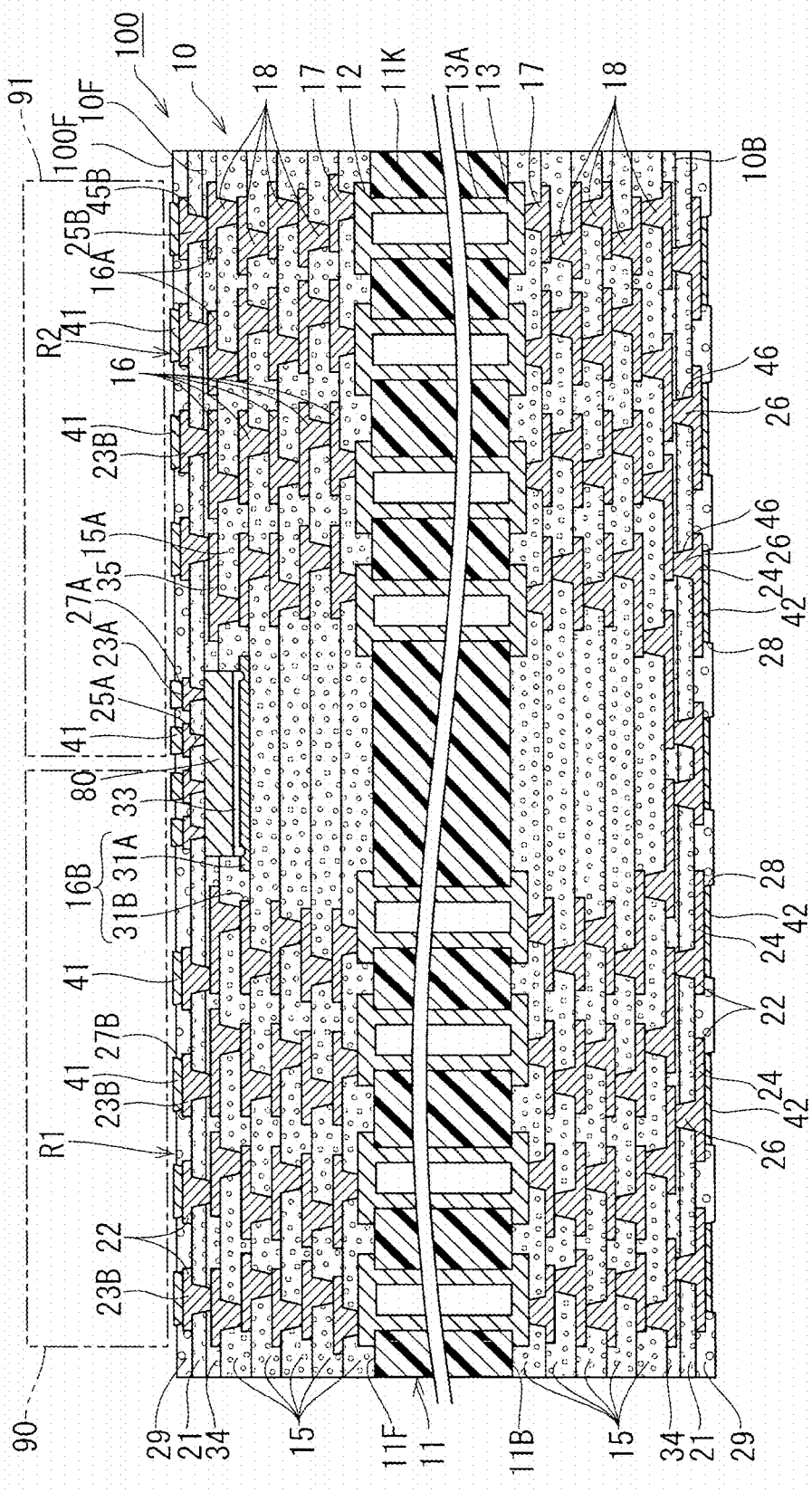
FIG. 7 is a cross-sectional view of a wiring board with a built-in electronic component.

The wiring board 10 of the present embodiment is used in manufacturing a wiring board 100 with a built-in electronic component illustrated in FIG. 7. The wiring board 100 with a built-in electronic component has a structure in which an outer side build-up insulating layer 21 and an outer side build-up conductor layer 22 are further laminated on each of both the front and back surfaces of the wiring board 10, and the outer side build-up conductor layer 22 is covered by a solder resist layer 29. The solder resist layer 29 has a thickness of about 7-30 μm. The outer side build-up insulating layer 21 is formed of the same material as the above-described build-up insulating layers 15 and has a thickness of about 15 μm. The outer side build-up conductor layer 22 is formed of the same material as the build-up conductor layers 16 and has a thickness of about 15 μm. Here, similar to the build-up insulating layers 15, the thickness of the outer side build-up insulating layer 21 is defined by a distance between the conductor layers above and below the outer side build-up insulating layer 21. Further, the thickness of the solder resist layer 29 is defined by a distance from an upper surface of the outer side build-up conductor layer 22 to an upper surface of the solder resist layer 29.

Element mounting regions (R1, R2) for mounting semiconductor elements (90, 91) are formed on an F surface (100F) of the wiring board 100 with a built-in electronic component. The cavity 30 is arranged on an inner side of a boundary portion of the element mounting regions (R1, R2). An interposer 80 as an "electronic component" according to an embodiment of the present invention is accommodated in the cavity 30. The interposer 80 electrically connects the semiconductor elements (90, 91) that are respectively mounted in the element mounting regions (R1, R2).

Specifically, as illustrated in FIG. 8, a bonding layer 33 is formed on the plane layer (31A) that is exposed as the bottom surface of the cavity 30, and the interposer 80 is mounted on the bonding layer 33. Here, due to the recess 32 of the plane layer (31A), an anchor effect is exerted on the bonding layer 33, and peeling of the bonding layer 33 from the plane layer (31A) is suppressed. In addition, due to the roughened layer 36 that is formed on the surface of the plane layer (31A) that is exposed as the bottom surface of the cavity 30, peeling of the bonding layer 33 from the plane layer (31A) is further suppressed.

As illustrated in FIG. 7, a first conductor pad 24 is formed in the outer side build-up conductor layer 22 on the B surface (10B) side of the wiring board 10. The first conductor pad 24 is connected to the build-up conductor layer 16 on the B surface (10B) side of the wiring board 10 via a first via 26 that penetrates through the outer side build-up insulating layer 21.

Further, a first opening 28 that exposes the first conductor pad 24 is formed in the solder resist layer 29 on the B surface (10B) side of the wiring board 10, and a first plating layer 42 is formed on the first conductor pad 24. The first plating layer 42 is recessed with respect to an outer surface of the first solder resist layer (29B). The first plating layer 42 is formed by electroless Ni/Pd/Au metal layers. Of the electroless Ni/Pd/Au metal layers, the Ni layer has a thickness of 3-10 μm; the Pd layer has a thickness of 0.1-1 μm; and the Au layer has a thickness of 0.03-0.1 μm.

As illustrated in FIG. 7, a second small-diameter pad (23A) that is arranged on the interposer 80 and a second large-diameter conductor pad (23B) that is arranged on the outer side conductor circuit layer 35 are formed in the outer side build-up conductor layer 22 on the F surface (10F) side of the wiring board 10. As illustrated in FIG. 8, the second large-diameter conductor pad (23B) is connected to the first build-up layer (16A) via a second large-diameter via (25B) that penetrates through the outer side build-up insulating layer 21 and the protective layer 34. Further, the second small-diameter conductor pad (23A) is connected to the interposer 80 via a second small-diameter via (25A) that penetrates through the outer side build-up insulating layer 21.

A second small-diameter opening (27A) that exposes the second small-diameter conductor pad (23A) and a second large-diameter opening (27B) that exposes the second large-diameter conductor pad (23B) are formed in the solder resist layer 29 on the F surface (10F) side of the wiring board 10. A second plating layer 41 is formed on each of the second small-diameter conductor pad (23A) and the second large-diameter conductor pad (23B). The second plating layer 41 protrudes in a bump-like shape to an outer side of the second solder resist layer 29. Specifically, the second plating layer 41 on the second small-diameter conductor pad (25A) penetrates through the second small-diameter opening (27A), and the second plating layer 41 on the second large-diameter conductor pad (25B) penetrates through the second large-diameter opening (27B). Similar to the first plating layer 42, the second plating layer 41 is formed by electroless Ni/Pd/Au metal layers. Of the electroless Ni/Pd/Au metal layers, the Ni layer has a thickness of 10-35 μm;

the Pd layer has a thickness of 0.1-1 µm; and the Au layer has a thickness of 0.03-0.1 µm. Here, the thickness of the Ni layer in the second plating layer 41 is defined by a sum of the thickness of the solder resist layer 29 and a thickness of the Ni layer that protrudes from the solder resist layer 29.

The wiring board 100 with a built-in electronic component is manufactured as follows.

(1) As illustrated in FIG. 9A, the bonding layer 33 is laminated on the plane layer (31A) that is exposed as the bottom surface of the cavity 30 of the wiring board 10, and the interposer 80 is placed on the bonding layer 33, and a thermal curing process and a CZ process are performed.

Figure 10A:
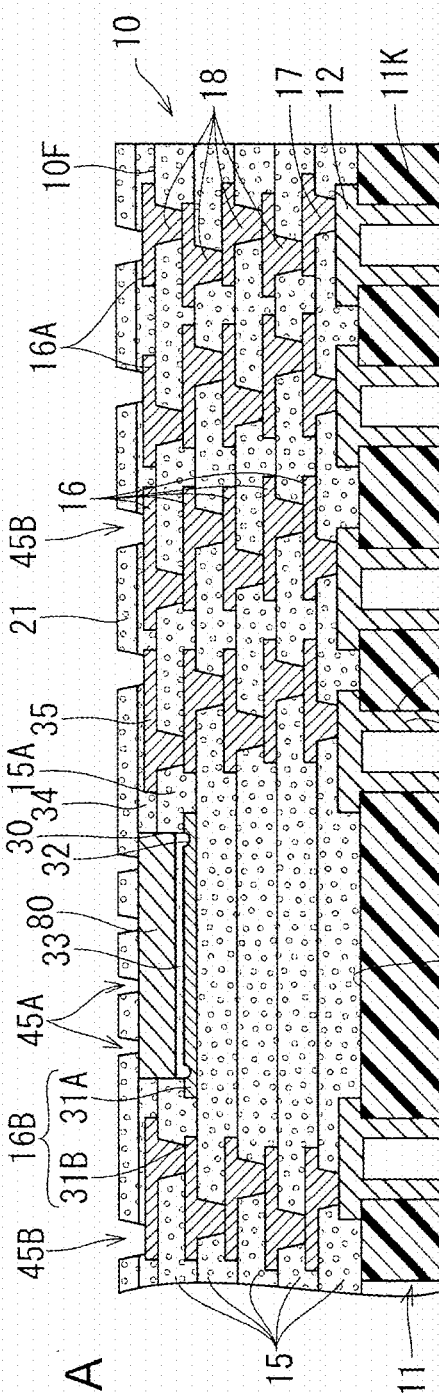
FIGS. 10A and 10B are cross-sectional views illustrating manufacturing processes of the wiring board with the built-in electronic component.
Figure 10B:
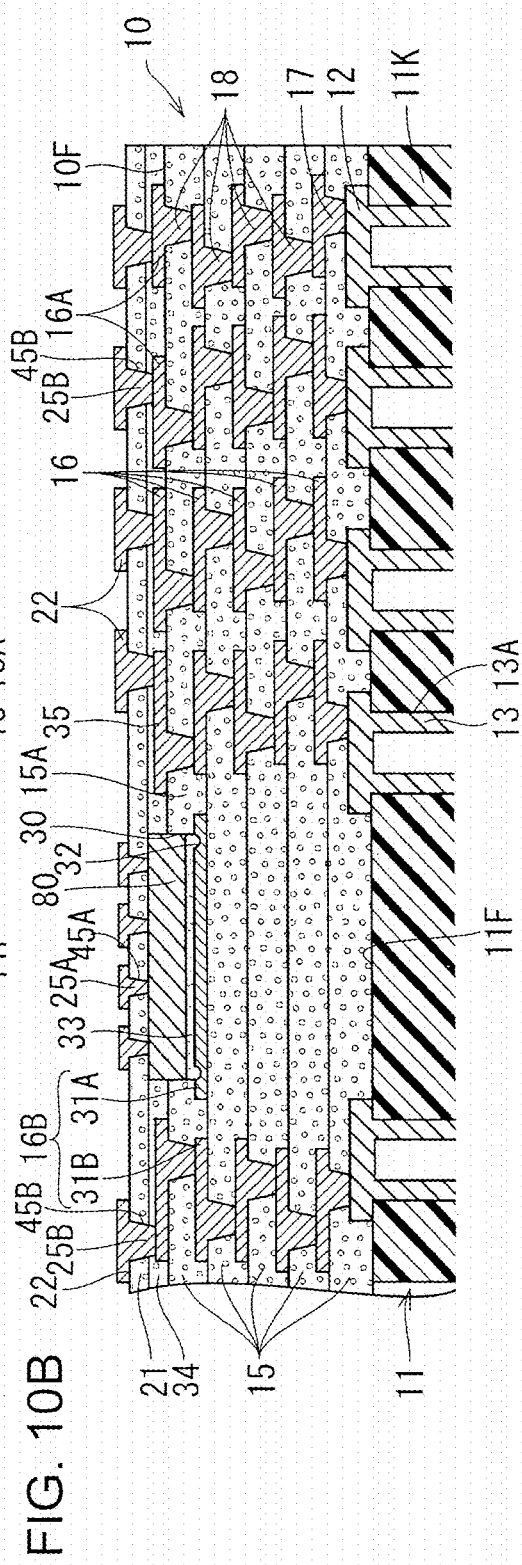

(2) The outer side build-up insulating layer 21 made of the same material as the build-up insulating layers 15 is laminated on each of the F surface (10F) and the B surface (10B) of the wiring board 10 (see FIG. 9B; in FIG. 9B, only the F surface (10F) side is illustrated; this applies also to FIGS. 10A and 10B).

(3) A second small-diameter via formation hole (45A) and a second large-diameter via formation hole (45B) are formed in the outer side build-up insulating layer 21 by irradiating laser from the F surface (10F) side of the wiring board 10 (see FIG. 10A), and a first via formation hole 46 is formed by irradiating laser from the B surface (10B) side of the wiring board 10. In doing so, on the B surface (10B) side, for example, by irradiating infrared laser, the first via formation hole 46 having a relatively large diameter is formed (see FIG. 7). Further, on the F surface (10F) side, for example, by irradiating infrared laser, the second large-diameter via formation hole (45B) having a diameter smaller than that of the first via formation hole 46 is formed, and, for example, by irradiating visible or ultraviolet laser, the second small-diameter via formation hole (45A) having a diameter smaller than that of the second large-diameter via formation hole (45B) is formed. The first via formation hole 46 has an opening diameter of about 150 µm; the second large-diameter via formation hole (45B) has an opening diameter of about 60 µm; and the second small-diameter via formation hole (45A) has an opening diameter of about 20-30 µm.

(4) An electroless plating treatment, a plating resist treatment and an electrolytic plating treatment are performed. On the F surface (10F) side of the wiring board 10, the second small-diameter via (25A) and the second large-diameter via (25B) are respectively formed in the second small-diameter via formation hole (45A) and the second large-diameter via formation hole (45B) (see FIG. 10B); and on the B surface (10B) side of the wiring board 10, the first via 26 is formed in the first via formation hole 46. Further, the outer side build-up conductor layer 22 is formed on the outer side build-up insulating layer 21.

Figure 11:
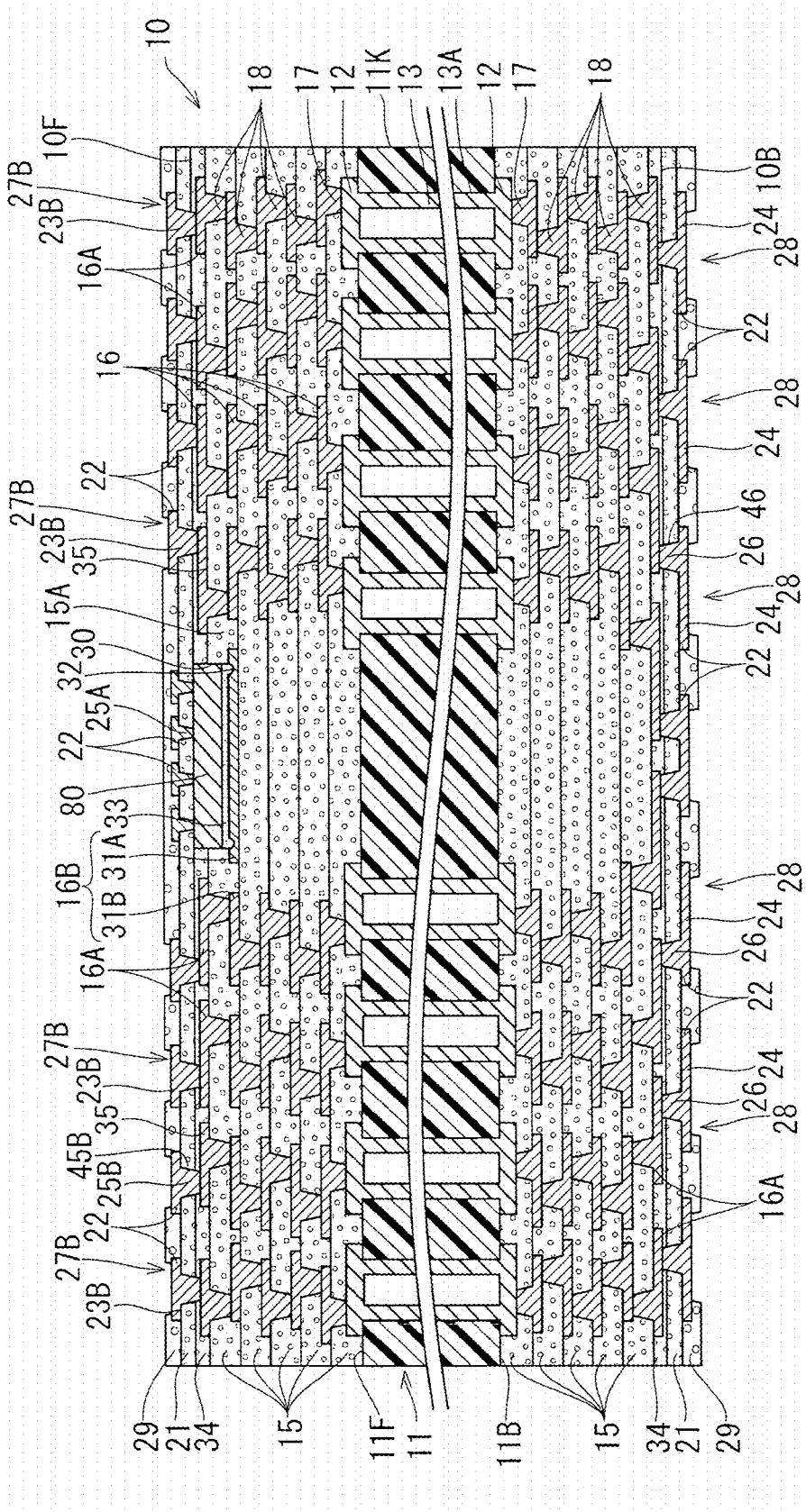
FIG. 11 is a cross-sectional view illustrating a manufacturing process of the wiring board with the built-in electronic component.

(5) As illustrated in FIG. 11, the solder resist layers 29 are respectively laminated on the outer side build-up conductors layer 22 from both the F surface (10F) side and the B surface (10B) side of the wiring board 10; and, by a lithographic treatment, the second large-diameter opening (27B) that exposes a portion of the outer side build-up conductor layer 22 as the second large-diameter conductor pad (23B) is formed in the second solder resist layer 29 on the F surface (10F) side, and the second opening 28 that exposes a portion of the outer side build-up conductor layer 22 as the first conductor pad 24 is formed in the solder resist layer 29 on the B surface (10B) side.

Figure 12:
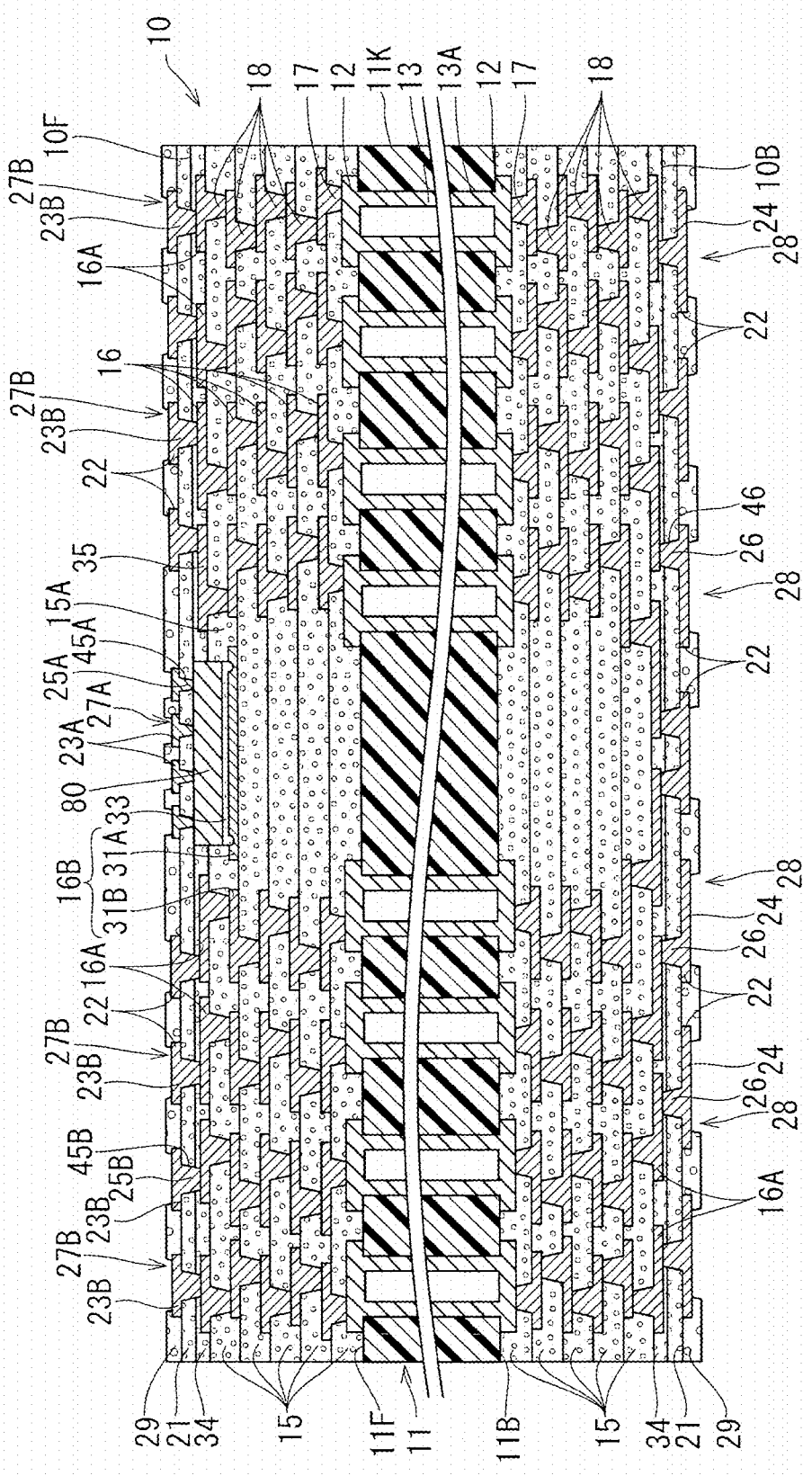
FIG. 12 is a cross-sectional view illustrating a manufacturing process of the wiring board with the built-in electronic component.

(6) As illustrated in FIG. 12, by irradiating visible or ultraviolet laser from the F surface (10F) side of the wiring board 10, the second small-diameter opening (27A) that exposes a portion of the outer side build-up conductor layer 22 as the second small-diameter conductor pad (23A) is formed.

Figure 13:
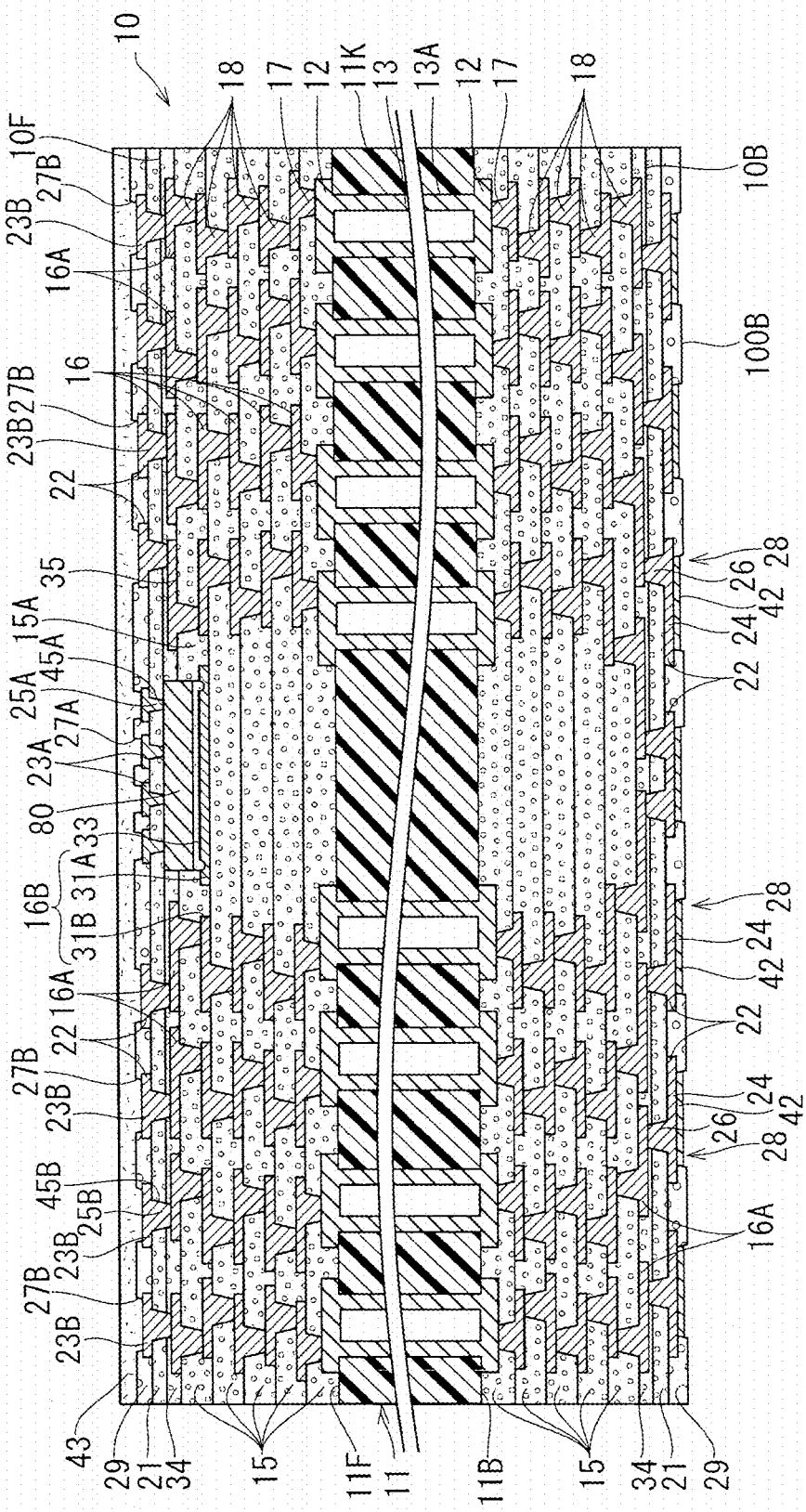
FIG. 13 is a cross-sectional view illustrating a manufacturing process of the wiring board with the built-in electronic component.

(7) As illustrated in FIG. 13, the solder resist layer 29 on the F surface (10F) side of the wiring board 10 is covered by a resin protective film 43. Then, the B surface (10B) side of the wiring board 10 is subjected to an electroless plating treatment, and the first plating layer 42 is formed on the first conductor pad 24. In doing so, the second small-diameter conductor pad (23A) and the second large-diameter conductor pad (23B) are protected by the resin protective film 43.

Figure 14:
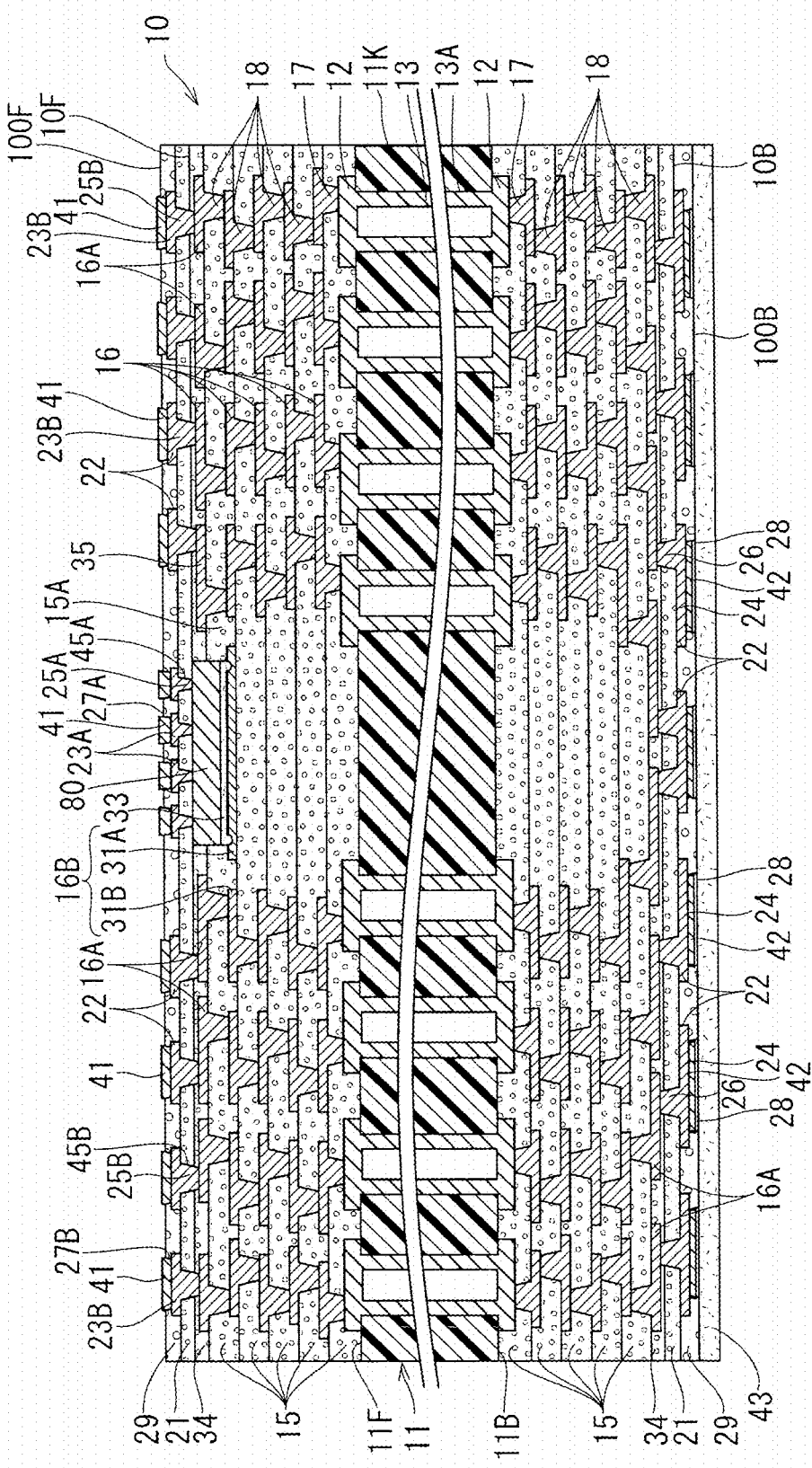
FIG. 14 is a cross-sectional view illustrating a manufacturing process of the wiring board with the built-in electronic component.

(8) As illustrated in FIG. 14, the resin protective layer 43 on the F surface (10F) side of the wiring board 10 is removed, and the solder resist layer 29 on the B surface (10B) side of the wiring board 10 is covered by a resin protective layer 43. Then, the F surface (10F) side of the wiring board 10 is subjected to an electroless plating treatment, and the second plating layer 41 is formed on the second small-diameter conductor pad (23A) and the second large-diameter conductor pad (23B). In doing so, the first plating layer 42 is protected by the resin protective film 43.

(9) The resin protective layer 43 that covers the solder resist layer 29 on the B surface (10B) side of the wiring board 10 is removed, and the wiring board 100 with the built-in electronic component illustrated in FIG. 7 is completed.

The above is the description of the method using the wiring board 10 for manufacturing the wiring board 100 with an electronic component. Next, an operation effect of the wiring board 10 of the present embodiment is described.

According to the wiring board 10 of the present embodiment, the recess 32 is formed at least in an outer peripheral portion of the portion of the plane layer (31A) that is exposed as the bottom surface of the cavity for the built-in electronic component 30. Therefore, peeling of the bonding layer 33 that is formed on the plane layer (31A) is suppressed, and fixation of the electronic component (the interposer 80) that is mounted on the plane layer (31A) via the bonding layer 33 can be stabilized. In addition, the roughened layer 36 is formed on the surface of the plane layer (31A). Therefore, peeling of the bonding layer 33 can be further suppressed. Further, the opening area of the cavity 30 is smaller than the area of the plane layer (31A). Therefore, the plane layer (31A) can be easily exposed as the entire bottom surface of the cavity 30.

Further, in the wiring board 10 of the present embodiment, the protective layer 34 is formed on the outer side conductor circuit layer 35 that connects to the conductor circuit layer (31B). Therefore, when the plane layer (31A) is subjected to the desmear treatment, damage to the outer side conductor circuit layer 35 is suppressed. In addition, the protective layer 34 is made of the same material as the build-up insulating layers 15. Therefore, integration of the protective layer 34 and the build-up insulating layers 15 can be achieved by hot pressing.

Further, in the wiring board 10 of the present embodiment, the plane layer (31A) becomes a ground layer. Therefore, the plane layer (31A) that is exposed as the bottom surface of the cavity 30 can be used as a ground of the electronic component. Further, the plane layer (31A) has the same thickness as the conductor circuit layer (31B). Therefore, the plane layer (31A) and the conductor circuit layer (31B) can be formed in the same process.

Other Embodiments

The present invention is not limited to the above-described embodiment. For example, embodiments described below are also included in the technical scope of the present invention. Further, in addition to the embodiments described below, the present invention can also be embodied in various modified forms within the scope without departing from the spirit of the present invention.

Figure 16A:
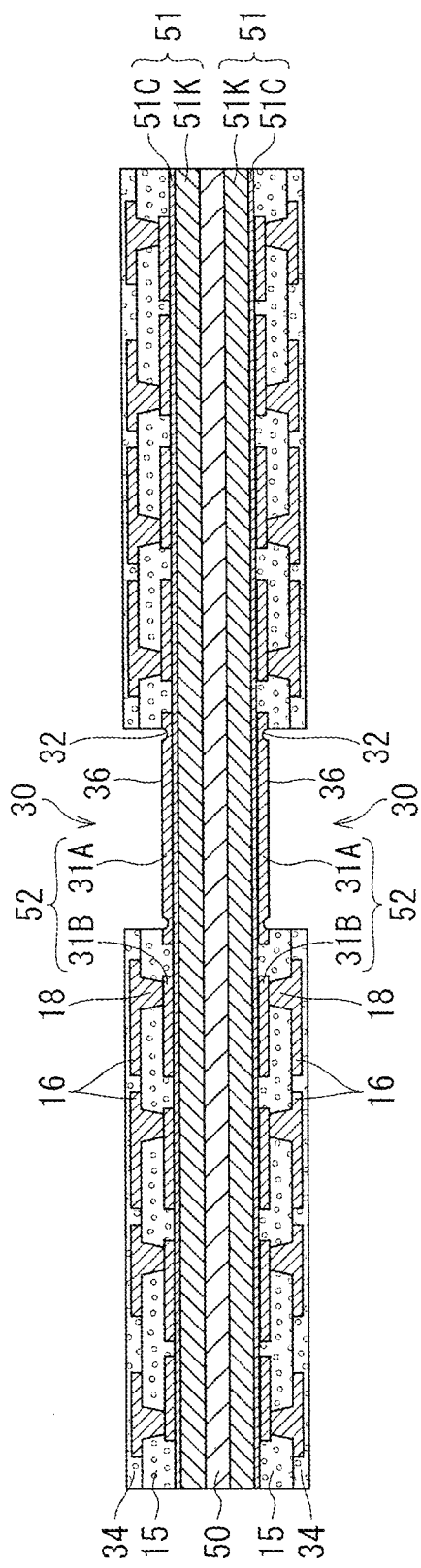
FIGS. 16A and 16B illustrate manufacturing processes of the wiring board with the cavity for a built-in electronic component according to the modified embodiment.
Figure 16B:
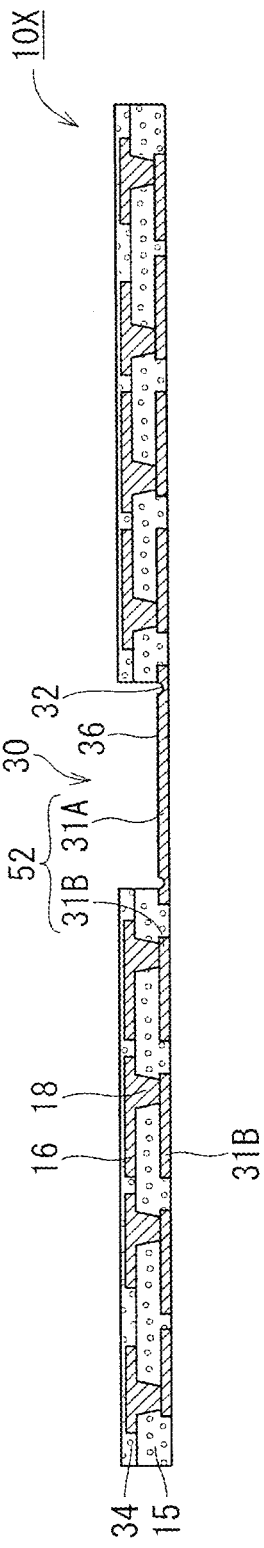

(1) In the above embodiment, the wiring board 10 is a substrate that has the core substrate 11. However, as in a case of a wiring board (10X) illustrated in FIG. 16B, a wiring board may also be a so-called coreless substrate that does not have a core substrate. Such a wiring board (10X) is manufactured, for example, using a method illustrated in the following 1-5.

Figure 15A:
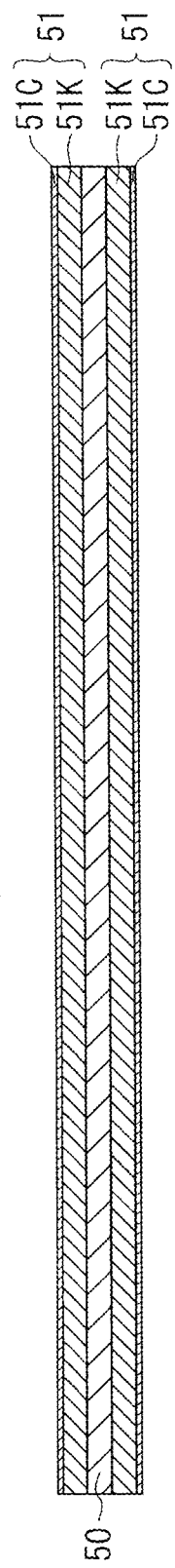
FIG. 15A-15C illustrate manufacturing processes of a wiring board with a cavity for a built-in electronic component according to a modified embodiment.

1. As illustrated in FIG. 15A, a copper foil 51 with a carrier that is obtained by laminating a copper foil (51C) on an upper surface of a carrier (51K) is laminated on a support substrate 50. A bonding layer (not illustrated in the drawings) is formed between the carrier (51K) and the copper foil (51C) and between the carrier (51K) and the support substrate 50. An adhesive force between the carrier (51K) and the copper foil (51C) is weaker than an adhesive force between the carrier (51K) and the support substrate 50.

Figure 15B:
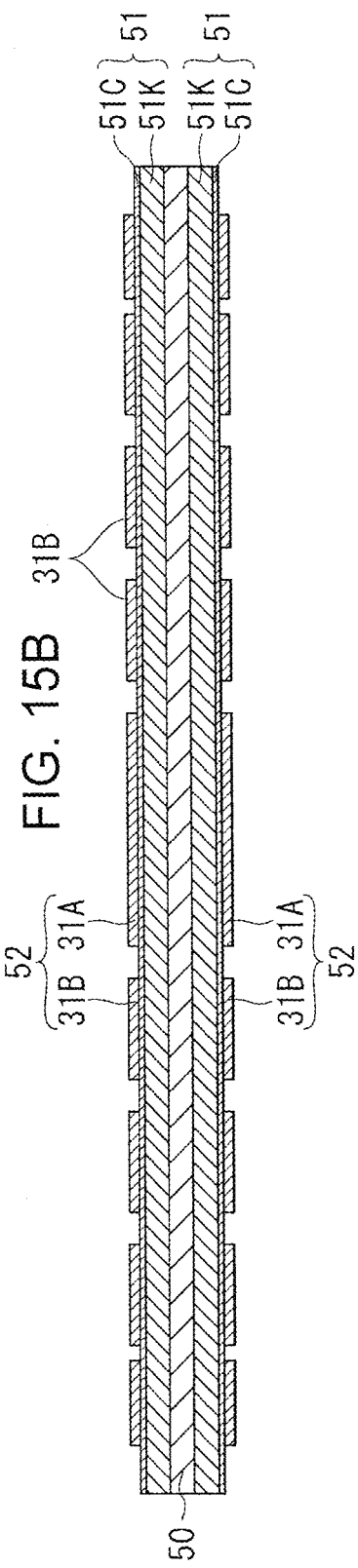

2. A plating resist of a predetermined pattern is formed on the copper foil (51C). Then, by an electrolytic plating treatment, an electrolytic plating film is formed in a non-forming part of the plating resist, and an inner side conductor layer 52 having a plane layer (31A) and a conductor circuit layer (31B) is formed on the copper foil (51C) (see FIG. 15B).

Figure 15C:
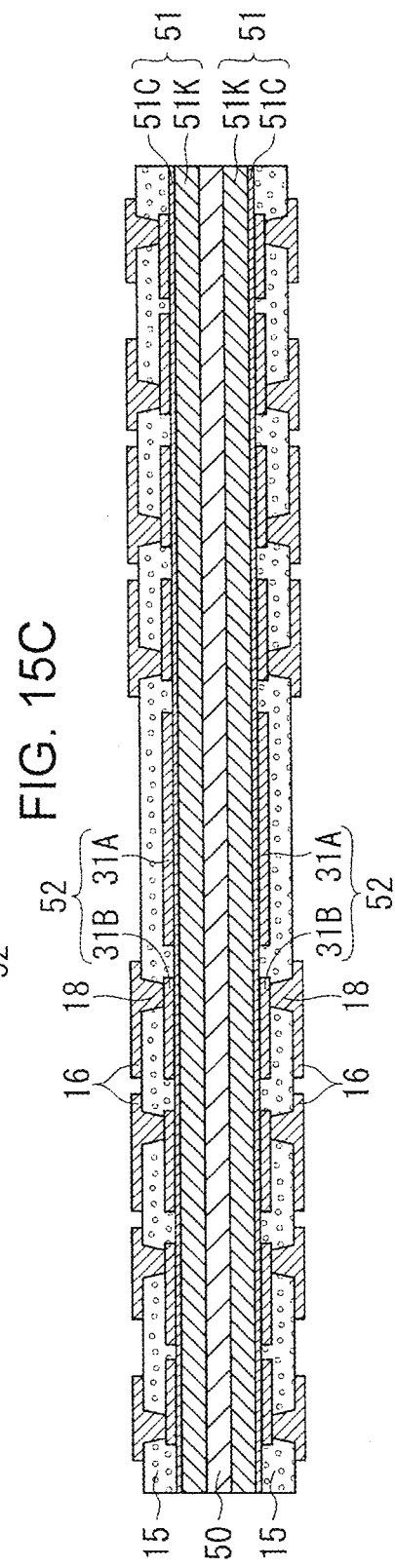

3. A build-up insulating layer 15 is laminated on the inner side conductor layer 52, and a build-up conductor layer 16 that is connected to the conductor circuit layer (31B) via a via 18 is formed on the build-up insulating layer 15 (see FIG. 15C).

4. A protective layer 34 is laminated on the build-up conductor layer 16. A cavity 30 that penetrates through the protective layer 34 and the build-up insulating layer 15 and exposes the plane layer (31A) as a bottom surface is formed by laser processing, and the bottom surface of the cavity 30 is subjected to a roughening treatment to form a roughened surface 36 (see FIG. 16A). In this case, a recess 32 is formed in an outer peripheral portion of the bottom surface of the cavity 30.

5. The carrier (51K) of the copper foil 51 with the carrier, and the support substrate 50, are peeled off. Thereafter, the copper foil (51C) is removed by an etching process, and the wiring board (10X) is completed (see FIG. 16B). Thereafter, processes as illustrated in FIG. 9A-14 may be performed.

(2) In the wiring board 10 of the above embodiment, a structure is adopted in which the conductor circuit layer (31B) and the plane layer (31A) are formed in the second build-up conductor layer (16B) that is positioned second from the outer side. However, as in a case of a wiring board (10V) illustrated in FIG. 17, it is also possible to adopt a structure in which the conductor circuit layer (31B) and the plane layer (31A) are formed in the outermost first build-up conductor layer (16A).

Figure 18:
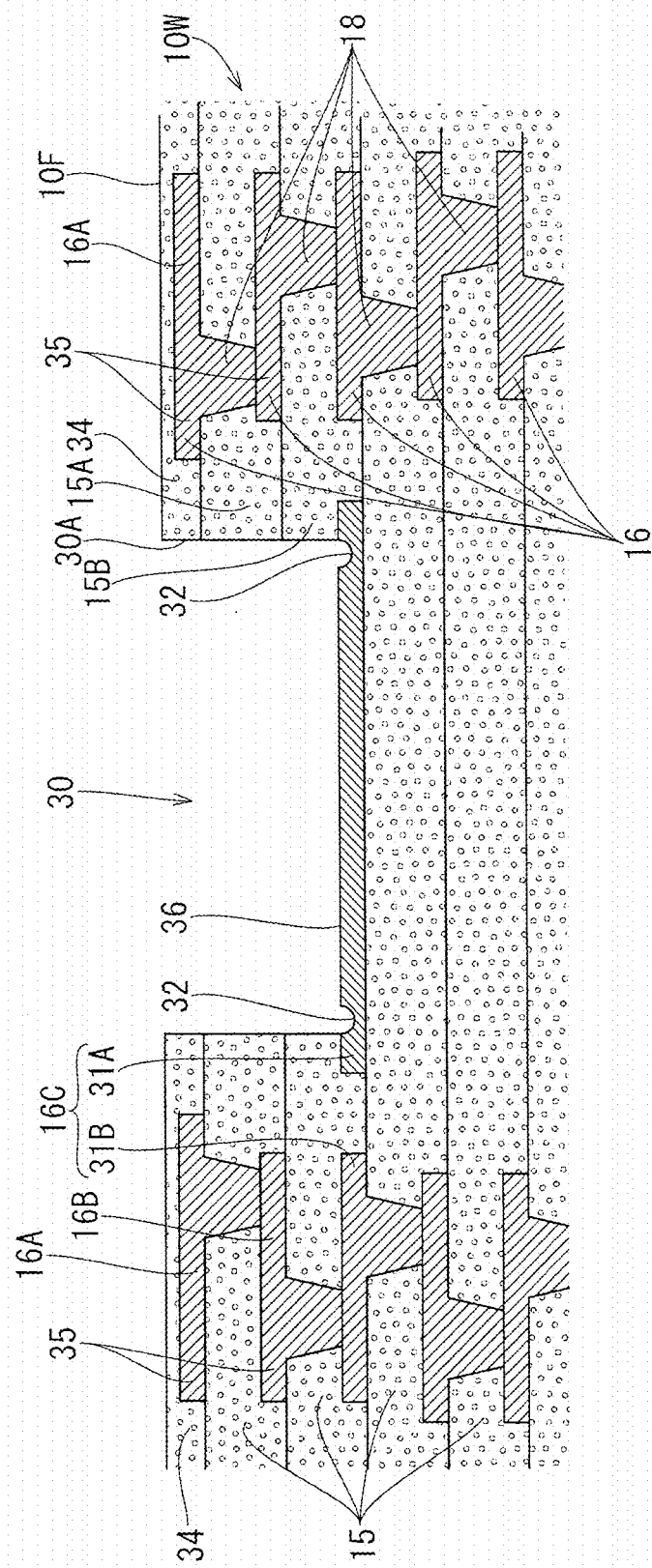
FIG. 18 is a cross-sectional view of a wiring board with a cavity for a built-in electronic component according to a modified embodiment.

(3) In the wiring board 10 of the above embodiment, a structure is adopted in which only the one outer side conductor circuit layer 35 is laminated on the conductor circuit layer (31B). However, as in a case of a wiring board (10W) illustrated in an example of FIG. 18, it is also possible to adopt a structure in which two or more conductor circuit layers are laminated on the conductor circuit layer (31B). In the example of FIG. 18, the plane layer (31A) and the conductor circuit layer (31B) are formed in a third build-up conductor layer (16C) that is positioned third from the outer side, and an outer side conductor circuit layer 35 is formed in each of the first build-up conductor layer (16A) and the second build-up conductor layer (16B). Further, the cavity 30 penetrates through a second build-up insulating layer (15B) that is positioned second from the outer side, the first build-up insulating layer (15A) and the protective layer 34.

(4) In the above embodiment, the plane layer (31A) is a ground layer. However, it is also possible that the plane layer (31A) is a power source layer.

(5) In the above embodiment, as illustrated in FIG. 19A, the recess 32 is formed only in the outer peripheral portion of the portion of the plane layer (31A) that is exposed as the bottom surface of the cavity 30. However, it is also possible that, in addition to the outer peripheral portion, the recess 32 is formed in a portion other than the outer peripheral portion (for example, in a central portion). Specifically, the recess 32 may be formed in shapes illustrated in FIG. 19B-19D.

In a wiring board with a cavity for a built-in electronic component, there may be a problem that fixation of the electronic component is unstable.

A wiring board with a cavity for a built-in electronic component according to an embodiment of the present invention is capable of stabilizing fixation of the electronic component, and another embodiment of the present invention is a method for manufacturing such a wiring board.

A wiring board with a cavity for a built-in electronic component according to one aspect of the present invention includes: a conductor layer in which a conductor circuit layer and a plane layer are formed; an insulating layer that is laminated on the conductor layer; and a cavity for a built-in electronic component that penetrates through the insulating layer and exposes the plane layer as a bottom surface. A recess is formed at least in an outer peripheral portion of a portion of the plane layer that is exposed as the bottom surface of the cavity.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a cavity for a built-in electronic component, comprising:
   a conductor layer comprising a conductor circuit layer and a plane layer; and
   an insulating layer laminated on the conductor layer and having a cavity such that the cavity is forming an exposed portion of the plane layer and configured to mount a built-in electronic component on the exposed portion of the plane layer,
   wherein the insulating layer is laminated on the conductor layer such that the insulating layer is covering the conductor circuit layer and the plane layer, and the exposed portion of the plane layer has an outer peripheral portion along an edge portion of the cavity such that the plane layer has a recess structure formed in the outer peripheral portion of the exposed portion in the plane layer.

2. The wiring board with a cavity for a built-in electronic component according to claim 1, further comprising:
   an outer side conductor circuit layer laminated on the insulating layer;
   a via structure formed through the insulating layer such that the via structure is connecting the outer side conductor circuit layer and the conductor circuit layer of the conductor layer; and a protective layer laminated on the outer side conductor circuit layer such that the cavity of the insulating layer is penetrating through the protective layer.

3. The wiring board with a cavity for a built-in electronic component according to claim 2, wherein the protective layer has a thickness which is less than a thickness of the insulating layer.

4. The wiring board with a cavity for a built-in electronic component according to claim 2, wherein the protective layer and the insulating layer comprise a same material.

5. The wiring board with a cavity for a built-in electronic component according to claim 1, wherein the recess structure of the plane layer has a depth in a range of from 0.5 µm to 3 µm.

6. The wiring board with a cavity for a built-in electronic component according to claim 1, wherein the conductor circuit layer is formed such that the conductor circuit layer and the plane layer have a same thickness.

7. The wiring board with a cavity for a built-in electronic component according to claim 1, wherein the plane layer has a roughened layer formed on a surface of the exposed portion.

8. The wiring board with a cavity for a built-in electronic component according to claim 1, wherein the cavity has an opening area which is smaller than a surface area of the plane layer.

9. The wiring board with a cavity for a built-in electronic component according to claim 1, wherein the plane layer is forming a ground layer.

10. The wiring board with a cavity for a built-in electronic component according to claim 1, wherein the recess structure of the plane layer comprises a plurality of recess portions formed in the outer peripheral portion in the exposed portion of the plane layer.

11. The wiring board with a cavity for a built-in electronic component according to claim 1, wherein the recess structure of the plane layer comprises a recess portion formed in and along the outer peripheral portion in the exposed portion of the plane layer.

12. The wiring board with a cavity for a built-in electronic component according to claim 4, wherein the protective layer has a thickness which is less than a thickness of the insulating layer.

13. The wiring board with a cavity for a built-in electronic component according to claim 5, wherein the protective layer and the insulating layer comprise a same material.

14. The wiring board with a cavity for a built-in electronic component according to claim 2, wherein the recess structure of the plane layer has a depth in a range of from 0.5 µm to 3 µm.

15. The wiring board with a cavity for a built-in electronic component according to claim 2, wherein the protective layer and the insulating layer are made of a same material.

16. A method for manufacturing a wiring board with a cavity for a built-in electronic component, comprising:
forming an insulating layer on a conductor layer comprising a conductor circuit layer and a plane layer such that the insulating layer covers the conductor circuit layer and the plane layer; and
forming a cavity through the insulating layer such that the cavity forms an exposed portion of the plane layer and is configured to mount a built-in electronic component on the exposed portion of the plane layer; and
forming a recess structure in an outer peripheral portion in the exposed portion of the plane layer,
wherein the insulating layer is laminated on the conductor layer such that the insulating layer is covering the conductor circuit layer and the plane layer, and the exposed portion of the plane layer has the outer peripheral portion along an edge portion of the cavity such that the plane layer has the recess structure formed in the outer peripheral portion of the exposed portion in the plane layer.

17. The method for manufacturing a wiring board according to claim 16, wherein the forming of the cavity comprises applying laser processing upon the insulating layer such that the cavity is formed through the insulating layer, and the forming of the recess structure comprises applying laser processing upon the outer peripheral portion in the exposed portion of the plane layer.

18. The method for manufacturing a wiring board according to claim 16, further comprising:
applying desmear treatment on the exposed portion of the plane layer.

19. The method for manufacturing a wiring board according to claim 16, further comprising:
forming an outer side conductor circuit layer on the insulating layer;
forming a via structure through the insulating layer such that the via structure connects the outer side conductor circuit layer and the conductor circuit layer of the conductor layer; and
forming a protective layer on the outer side conductor circuit layer prior to the forming of the cavity through the insulating layer,
wherein the forming of the cavity through the insulating layer comprises forming the cavity penetrating through the protective layer and insulating layer.

20. The method for manufacturing a wiring board according to claim 16, further comprising:
applying roughening processing on a surface of the exposed portion of the plane layer such that the plane layer has a roughened layer formed on the surface of the exposed portion.

* * * * *